(12) United States Patent
Lin et al.

(10) Patent No.: US 6,455,887 B1
(45) Date of Patent: Sep. 24, 2002

(54) NONVOLATILE DEVICES WITH P-CHANNEL EEPROM DEVICE AS INJECTOR

(75) Inventors: Yai-Fen Lin, Taichung; Shiou-Hann Liaw, Hsiu-Chu; Di-Son Kuo, Hsinchu; Jian-Hsing Lee, Hsin-Chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/320,754

(22) Filed: May 27, 1999

Related U.S. Application Data

(62) Division of application No. 08/851,563, filed on May 7, 1997, now Pat. No. 5,933,732.

(51) Int. Cl.$^7$ ............................................. H01L 29/788
(52) U.S. Cl. ........................ 257/315; 257/316; 257/317; 257/314
(58) Field of Search ................................ 257/314–318, 257/321

(56) References Cited

U.S. PATENT DOCUMENTS

| | | | | |
|---|---|---|---|---|
| 4,646,425 A | | 3/1987 | Owens et al. ................. | 29/571 |
| 4,816,883 A | | 3/1989 | Baldi ......................... | 357/23.5 |
| 4,924,119 A | * | 5/1990 | Lee ............................ | 257/321 |
| 5,198,380 A | | 3/1993 | Harari ........................ | 437/43 |
| 5,465,231 A | * | 11/1995 | Ohsaki ....................... | 257/315 |
| 5,506,803 A | | 4/1996 | Jex ........................... | 365/185.23 |
| 5,506,816 A | | 4/1996 | Hirose et al. .............. | 365/230.06 |
| 5,596,524 A | * | 1/1997 | Lin et al. ................... | 257/315 |
| 5,763,912 A | * | 6/1998 | Parat et al. ................. | 257/315 |

* cited by examiner

Primary Examiner—Tom Thomas
Assistant Examiner—Thien F. Tran
(74) Attorney, Agent, or Firm—George O. Saile; Stephen B. Ackerman; Graham S. Jones, II

(57) ABSTRACT

An FET semiconductor device includes an N-region and a P-region formed in the substrate with the N-region juxtaposed with the P-region with an interface between the N-region and the P-region and with a first channel in the N-region and a second channel in the P-region. An N+ drain region is near the interface on one side of the first channel in the P-region. A P+ drain region is near the interface on one side of the second channel in the N-region. An N+ source region is on the opposite side of the first channel from the interface in the P-region. A P+ source region is on the opposite side of the first channel from the interface in the N-region. A wide gate electrode EEPROM stack bridges the channels in the N-region and the P-region. The stack includes a tunnel oxide layer, a floating gate electrode layer, an interelectrode dielectric layer, and a control gate electrode. An N+ drain region is formed in the surface of the P-region self-aligned with the gate electrode stack. A P+ drain region is formed in the surface of the N-region self-aligned with the gate electrode stack.

12 Claims, 7 Drawing Sheets

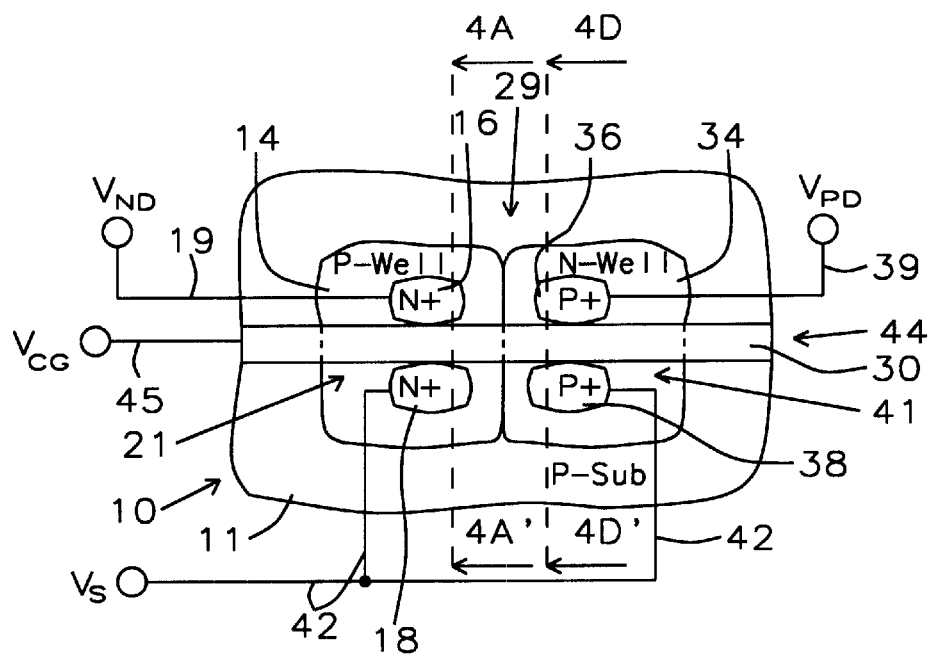
*FIG. 1A*
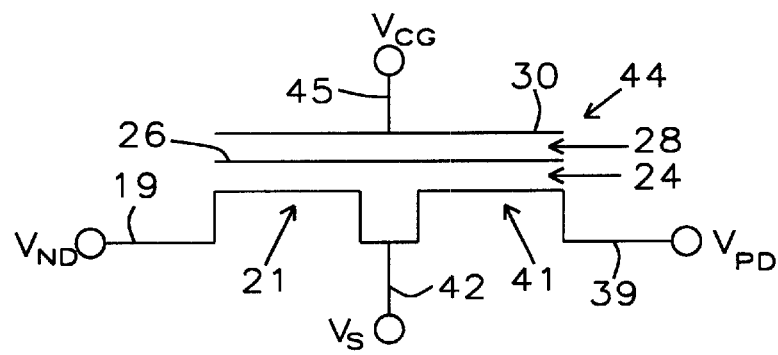
*FIG. 1B*
| | $V_{CG}$ | $V_{PD}$ | $V_{ND}$ | $V_S$ | $V_B$ |
|---|---|---|---|---|---|
| WRITE | −5 | −8 | GND | GND | GND |
| ERASE | −10 | GND | 8 | X | GND |
*FIG. 2*

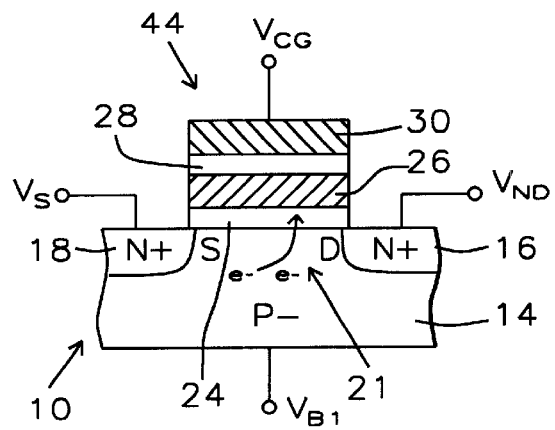 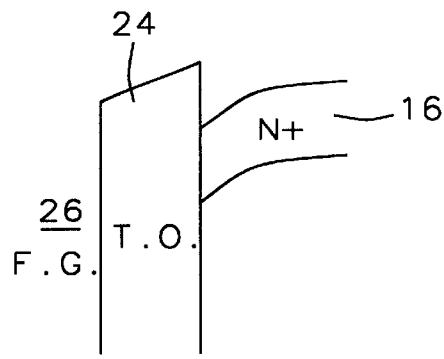
*FIG. 5A*  *FIG. 5B*
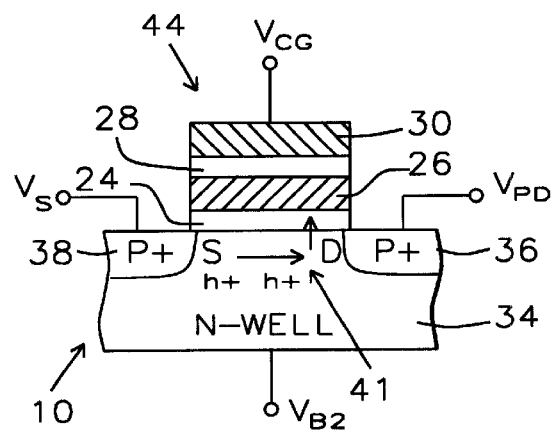 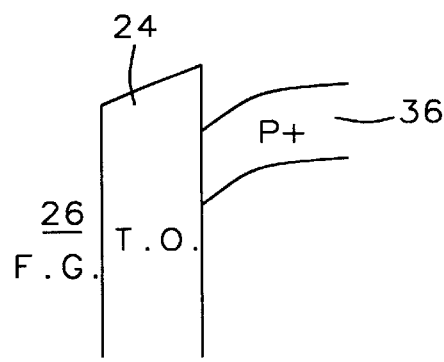
*FIG. 5C*  *FIG. 5D*

NONVOLATILE DEVICES WITH P-CHANNEL EEPROM DEVICE AS INJECTOR

This is a division of patent application Ser. No. 08/851,563, filing date May 7, 1997 now U.S Pat. No. 5,933,732, Nonvolatile Devices With P-Channel Eeprom Devices As Injector, assigned to the same assignee as the present invention.

BACKGROUND OF THE INVENTION

1. Field of the Invention

This invention relates to EPROM memory devices and more particularly to enhancement mode EPROM and flash EEPROM devices and method of fabrication of such devices.

2. Description of Related Art

EPROM (Erasable Programmable Read Only Memory) FET semiconductor devices provide long term retention of charge to store data. The charge is stored on a floating gate electrode which is not electrically connected to a terminal. Instead, the charge is supplied to the floating gate electrode through an insulator. The data may be erased by exposure of the device to ultraviolet light to erase the stored data by discharging the floating gate electrode.

EEPROM (Electrically Erasable Programmable Read Only Memory) FET semiconductor devices can be erased by electrical means instead of exposure to ultraviolet light.

Flash EPROM devices are EEPROM FET devices with a double gate electrode structure including a floating gate electrode and a control gate electrode with a dielectric layer thickness of about 100 Å thickness.

U.S. Pat. No. 5,198,380 (Harari); U.S. Pat. No. 4,816,883 (Baldi); U.S. Pat. No. 4,646,425 (Owens et al.) show methods of forming EPROM devices. However, these differ from the EEPROM of the invention.

U.S. Pat. No. 5,506,816 (Hirose et al.) shows a memory cell array having a compact word line arrangement. A subword line drives circuit has an NMOS transistor and a PMOS transistor, with the drain of the NMOS transistor and the source of the NMOS transistor connected to the word line. The source of the NMOS transistor and the drain of the PMOS transistor are connected to the receive a word line selection signal from a common source line. However, this differs form the EEPROM of the invention.

U.S. Pat. No. 5,506,803 (Jex) shows a memory device where the driver is a P-channel MOS having an N-well which is used program. However this differs from the EEPROM of the invention which uses a P-channel MOS to program and a N-channel MOS to write.

Problems which can occur with P-channel EEPROM devices include the fact that a P-channel EEPROM has higher Channel Hot Electron (CHE) injection current at lower gate voltage, and a P-channel EEPROM has serious drain disturbance and depletion issues.

SUMMARY OF THE INVENTION

Objects of this invention are to provide larger programming current and lower power dissipation; no drain disturbance; and enhancement mode devices instead of depletion mode devices.

Features of this invention are as follows:

1. An EEPROM device in accordance with this invention is programmed by the P-channel MOSFET and is read by an N-channel MOSFET which is integral with the P-channel with a shared floating gate and a shared control gate.

2. Thus the P-channel portion of the EEPROM is employed as a programming current injector.

3. The Read is provided by the N-channel portion of the EEPROM (or Flash EPROM).

4. One P-channel portion of an omnibus EEPROM can make contact to 1, 2, 4 or more N-channel portions of an EEPROM.

A method of forming an FET semiconductor device in accordance with this invention starts with a doped silicon semiconductor substrate having a surface, the substrate being lightly doped with a first type of dopant includes the following steps.

Form an N-region and a P-region in the substrate with the N-region in side by side relationship with the P-region with an interface between the N-region and the P-region and with a first channel in the N-region and a second channel in the P-region. Form the following gate electrode layers into a gate electrode stack by the following steps.

a) Form a tunnel oxide layer over the surface of the substrate above the N-region and the P-region covering the first channel and the second channel, the P+ drain region, the N+ drain region and the interface, b) Form a floating gate electrode layer over the tunnel oxide layer, c) Form an interelectrode dielectric layer over the floating gate electrode, d) Form a control gate electrode layer over the interelectrode dielectric layer, e) Pattern the gate electrode layers comprising the tunnel oxide layer, the floating gate electrode layer, the interelectrode dielectric layer, and the control gate electrode into a gate electrode stack with a mask spanning across the N-region and the P-region.

f) Etch away exposed portions of the gate electrode layers to provide a gate electrode stack spanning across the N-region and the P-region.

Then form N+ source/drain regions for an N-channel device in the P-region self-aligned with the stack; and form P+ source/drain regions for an N-channel device in the N-region self-aligned with the stack.

Then ion implant an N+ drain region in the surface of the P-region with an N type of dopant, the N+ drain region being self-aligned with the gate electrode stack, and ion implant a P+ drain region in the surface of the N-region with an N type of dopant. The P+ drain region is self-aligned with the gate electrode stack.

The P+ source/drain dopant comprises P type dopant ions of boron fluoride ion-implanted at an energy from about 30 keV to about 60 keV with a dose from about $1 \text{ E } 14$ ions/cm$^2$ to about $1 \text{ E } 15$ ions/cm$^2$.

The N+ source/drain dopant comprises N type dopant ions of arsenic ion-implanted at an energy from about 30 keV to about 60 keV with a dose from about $1 \text{ E } 14$ ions/cm$^2$ to about $1 \text{ E } 15$ ions/cm$^2$.

The tunnel oxide layer is from about 80 Å to about 100 Å thick.

The floating gate electrode comprises a layer from about 1,000 Å about 1,200 Å thick.

The interelectrode layer comprises a dielectric layer from about 150 Å to about 300 Å thick.

The control gate electrode comprises a layer from about 1,500 Å to about 3,000 Å thick.

The P-substrate is doped by P type dopant comprising boron atoms with a concentration from about $1 \text{ E } 13$ atoms/cm$^3$ to about $1 \text{ E } 15$ atoms/cm$^3$.

Also in accordance with this invention, an FET semiconductor device is formed on a doped silicon semiconductor substrate having a surface, the substrate being lightly doped with a first type of dopant includes an N-region and a P-region formed in the substrate with the N-region side by side relationship with the P-region with an interface between the N-region and the P-region and with a first channel in the N-region and a second channel in the P-region. A gate electrode stack over the surface of the substrate above the first channel and the second channel with the gate electrode stack bridging the channels in the N-region and the P-region. The source and drain N+ doped regions formed on opposite sides of the first channel in the P-region self-aligned with the gate electrode stack. The source and drain P+ doped regions formed on opposite sides of the first channel in the N-region self-aligned with the gate electrode stack.

The gate electrode stack extends as a common gate electrode stack from a single FET in a first one of the N-region and the P-region in the substrate to a plurality of FET devices in the other one of the N-region and the P-region.

The gate electrode stack extends as a common gate electrode stack from a single FET in a first one of the N-region and the P-region in the substrate to a plurality of FET devices arranged in series along the control gate electrode in the other one of the N-region and the P-region.

Alternatively, the gate electrode stack extends as a common gate electrode stack from a single FET in a first one of the N-region and the P-region in the substrate to a plurality of FET devices arranged in parallel along the control gate electrode in the other one of the N-region and the P-region.

The stack includes a tunnel oxide layer from about 80 Å to about 100 Å thick and a floating gate electrode comprising a layer from about 1,000 Å to about 1,200 Å thick.

The floating gate electrode is formed an interelectrode layer comprising a dielectric layer from about 150 Å to about 300 Å thick.

The interelectrode layer is formed a control gate electrode having a thickness from about 1,500 Å to about 3,000 Å.

The P+ source/drain dopant comprises P type dopant atoms with a concentration from about 1 E 18 atoms/cm$^3$ to about 1 E 20 atoms/cm$^3$, and the N+ source/drain dopant comprises N type dopant atoms with a concentration from about 1 E 18 atoms/cm$^3$ to about 1 E 20 atoms/cm$^3$.

The P-substrate is doped by P type dopant boron atoms with a concentration from about 1 E 13 atoms/cm$^3$ to about 1 E 15 atoms/cm$^3$, the tunnel oxide layer is from about 80 Å to about 100 Å thick, the floating gate electrode comprises a layer from about 1,000 Å to about 1,200 Å thick, the interelectrode layer comprises a dielectric layer from about 150 Å to about 300 Å thick, the control gate electrode comprises a layer from about 1,500 Å to about 3,000 Å thick. The P+ source/drain dopant comprises P type dopant atoms of boron fluoride with a concentration from about 1 E 18 atoms/cm$^3$ to about 1 E 20 atoms/cm$^3$, and the N+ source/drain dopant comprises N type dopant atoms of arsenic with a concentration from about 1 E 18 atoms/cm$^3$ to about 1 E 20 atoms/cm$^3$.

BRIEF DESCRIPTION OF THE DRAWINGS

The foregoing and other aspects and advantages of this invention are explained and described below with reference to the accompanying drawings, in which:

FIG. 1A shows a plan view of an EEPROM or a Flash EEPROM in accordance with this device.

FIG. 1B shows a schematic diagram of the device of FIG. 1A.

FIG. 2 is a table showing the programming voltages for the device of FIGS. 1A and 1B.

FIG. 5A shows an N-channel EPROM in accordance with this invention formed in P-doped silicon region in which source/drain regions are formed.

FIG. 5B shows an energy band diagram for the device 10 of FIG. 5A.

FIG. 5C shows a P-channel stacked-gate electrode Flash EPROM, which is intended to have higher channel hot-electron injection rate of the kind seen in FIG. 5A.

FIG. 5D shows an energy band diagram for the device of FIG. 5C.

DESCRIPTION OF THE PREFERRED EMBODIMENT

Figure 3:
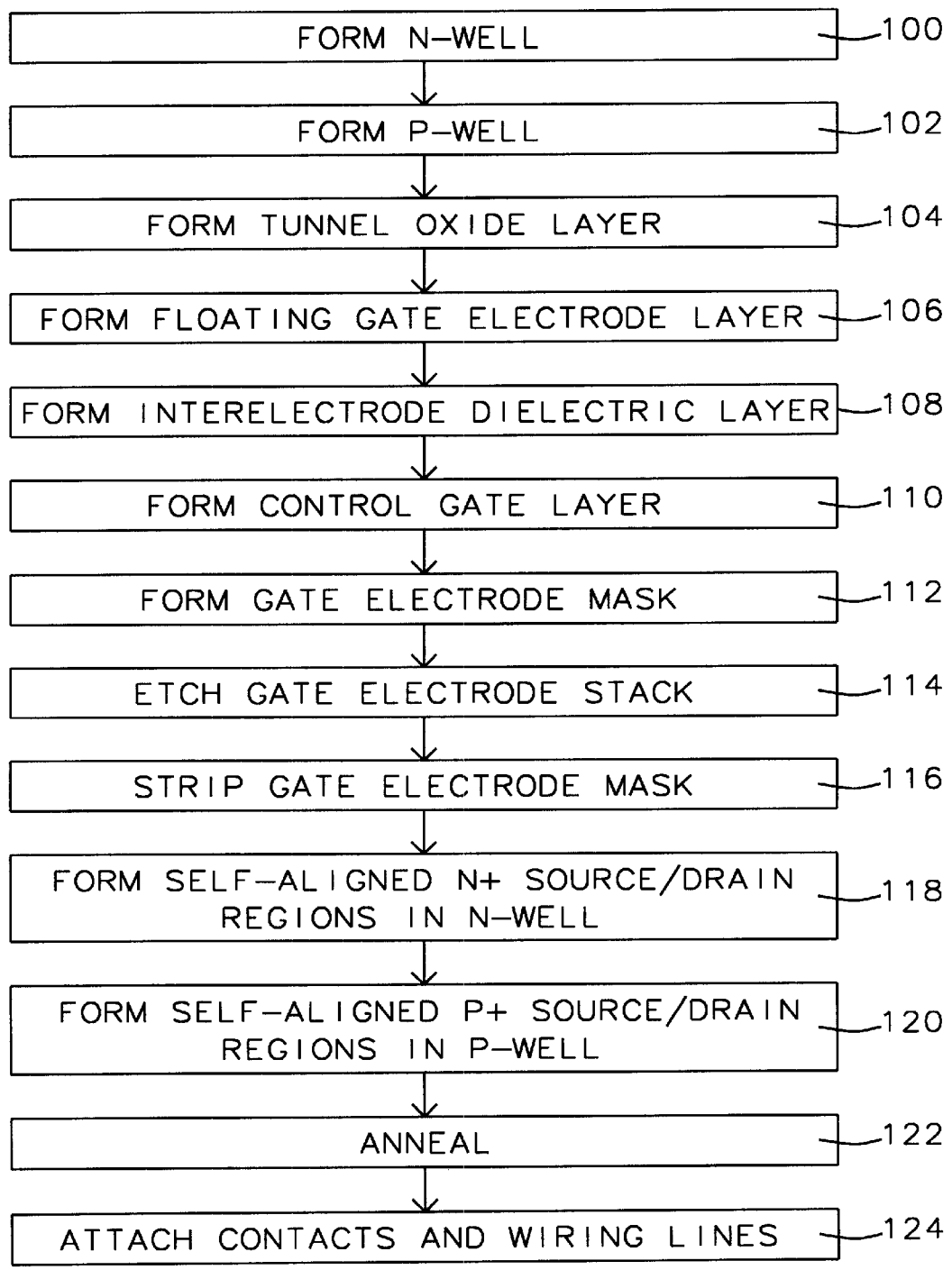
FIG. 3 shows a process flow chart for manufacturing a portion of a CMOS semiconductor device of FIGS. 1A–1B in accordance with the method of this invention.

A P-channel EEPROM can be programmed by Channel Hot Electron (CHE) injection current at a relatively low voltage. However, such a P-channel EEPROM device is prone to being depleted after being programmed with a CHE (Channel Hot Electron) process. In addition, drain disturbance is another problem which is difficult to overcome.

In a P-channel EEPROM or Flash EEPROM in accordance with this invention, a P-channel Flash EEPROM is employed as a CHE (Channel Hot Electron) injector during programming. In the design of this invention, the floating gates are tied together, so the threshold voltage of the N-channel EEPROM is raised to a high voltage.

In an alternative embodiment, if eight N-channel EEPROMs are tied to one P-channel EEPROM, then it is possible to program an overall EEPROM circuit, one byte at a time.

FIG. 1A shows a plan view of an EEPROM or a Flash EEPROM 10, including a lightly doped silicon semiconductor P-substrate, in which are formed an P Well 14, (doped with P-dopant) in which N+ doped source/drain regions 18/16 are formed with an N-channel region 21 therebetween. Substrate 11 also includes an N-doped N-Well 34 in which P+ doped source/drain regions 38/36 are formed with a P-channel region 41 therebetween. The N-well 14 and the P-well 34 are in side-by-side relationship (juxtaposed) in the substrate 11 with an interface 29 between P-well 14 and N-well 34, preferably without any spacing therebetween.

Alternatively, as will be well understood by those skilled in the art, the substrate 11 can be an N-substrate.

FIG. 1B shows a schematic diagram of the device of FIG. 1A with the same numbers applied to the same parts. The device is a double PMOS FET and and NMOS FET.

Referring again to FIG. 1A, as well as, FIG. 1B, a gate electrode stack 44 is located over the surface of both the P-well 14 and N-well 34. Stack 44 includes a tunnel oxide layer 24 formed on the surface of the P-well 14 and N-well 34, a floating gate electrode 26 formed on the surface of the tunnel oxide layer 24, an interelectrode dielectric layer 28 formed on the surface of the floating gate electrode 26 and a control gate electrode 30 formed on the surface of the interelectrode dielectric layer 28.

N+ doped source/drain regions 18/16 and P+ doped source/drain regions 38/36, are self-aligned with the gate electrode stack 44. The N+ doped drain region 16 is connected via line 19 to the voltage source $V_{ND}$. The P+ doped drain region 36 is connected via line 39 to the voltage source $V_{PD}$.

N+ doped source region 18 and P+ doped source region 38, which are self-aligned with the gate electrode stack 44, are located respectively in the P-well 14 and N-well 34. The source region 18 and the source region 38 are both connected to the Voltage source $V_S$.

Control gate electrode 30 is connected to the voltage source $V_{CG}$. Both the N+ doped source region 18 and the P+ doped source region 38 are connected together as well as being connected to the voltage source $V_S$ via lines 42. N+ drain region 16 is connected via line 19 to terminal $V_{ND}$. P+ drain region 36 is connected via line 39 to terminal $V_{PD}$. Lines 19 and 39 may be composed of a metal or a salicide material.

The programming voltages for the device of FIGS. 1A and 1B are shown in FIG. 2 and in Table I below. The Flash EEPROM 10 has a P-Channel EEPROM injector provided by the P+ drain 36 in N-well 34 which occurs when $V_{PD}=-8$ Volts is applied to line 39.

TABLE I

|  | $V_{CG}$ | $V_{PD}$ | $V_{ND}$ | $V_S$ | $V_B$ |
|---|---|---|---|---|---|
| WRITE | −5 | −8 | GND | GND | GND |
| ERASE | −10 | GND | 8 | X | GND |

Since the data is read at the N-channel EEPROM, the issue of depletion can be solved. In addition, during programming there is freedom from drain disturbance. Erasure can be performed by either an P-channel or an N-channel EEPROM. TABLE II shows the voltages for erasure with the voltage on $V_{PD}$.

TABLE II

|  | $V_{CG}$ | $V_D$ | $V_S$ | $V_B$ |
|---|---|---|---|---|
| WRITE | −5 V | −8 V | 0 V | 0 V |
| ERASE | −10 V | −8 V | X | 0 V |

There are advantages of this design in a P-channel Flash EPROM. In particular, hot electron injection current in P-channel cell can be two orders of magnitude greater than in an N-channel cell, while the channel current during programming in a P-channel cell is two orders of magnitude less than in an N-channel cell. In addition there are the advantages of high speed, low voltages, low power consumption and less gate disturbance.

Power (P) equals current (I) times voltage (V) as follows:

$$P = I \times V$$

Thus, a lower voltage leads to lower power consumption.

Main points of this invention are that the P-channel EEPROM as programming current injector; and the read function is performed at the N-channel EEPROM (or Flash EPROM). 3. One P-channel may contacts to 1, 2, 4 or more N-channel EEPROM (or Flash EPROM) devices.

Process of Manufacture of Dual Channel EEPROM Device

FIG. 3 shows a process flow chart for manufacturing a portion of a CMOS semiconductor device 10 of FIGS. 1A–1B in accordance with the method of this invention. As is conventional in this art, in order to simplify the description, the structure of only one memory FET device 10 is shown. Those skilled in the art will understand how this invention fits into the context of an overall device.

Figure 4A:
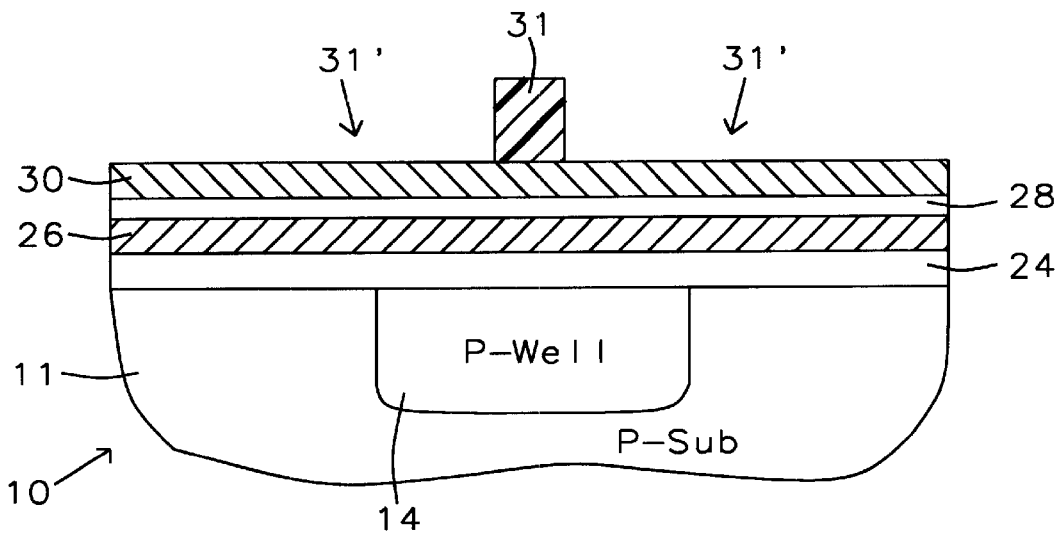
FIGS. 4A–4C are views of the device of FIG. 1A taken along line 4A–4A' in FIG. 1A illustrating the main aspects of the process of FIG. 3.
Figure 4B:
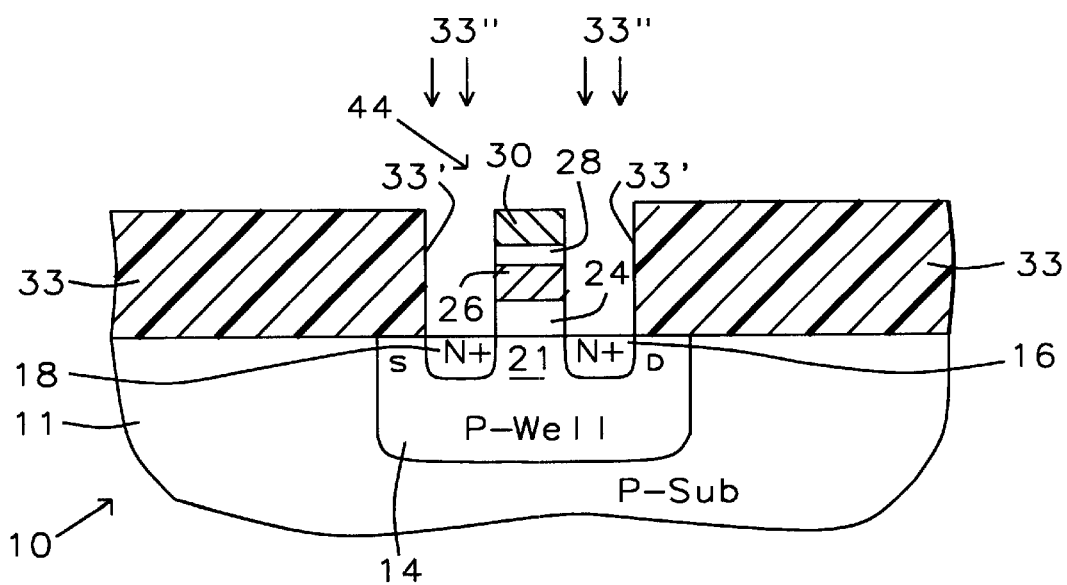
Figure 4C:
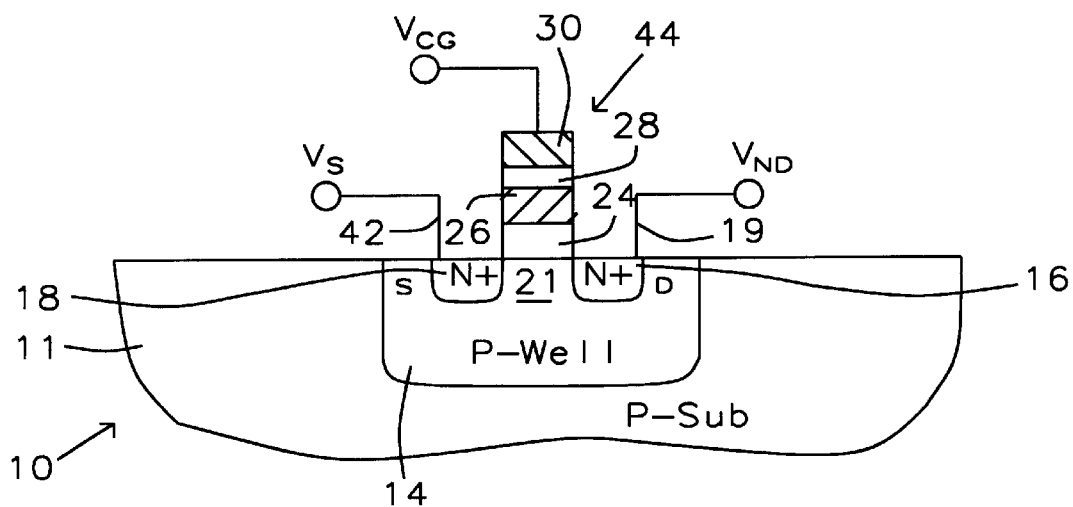
Figure 4D:
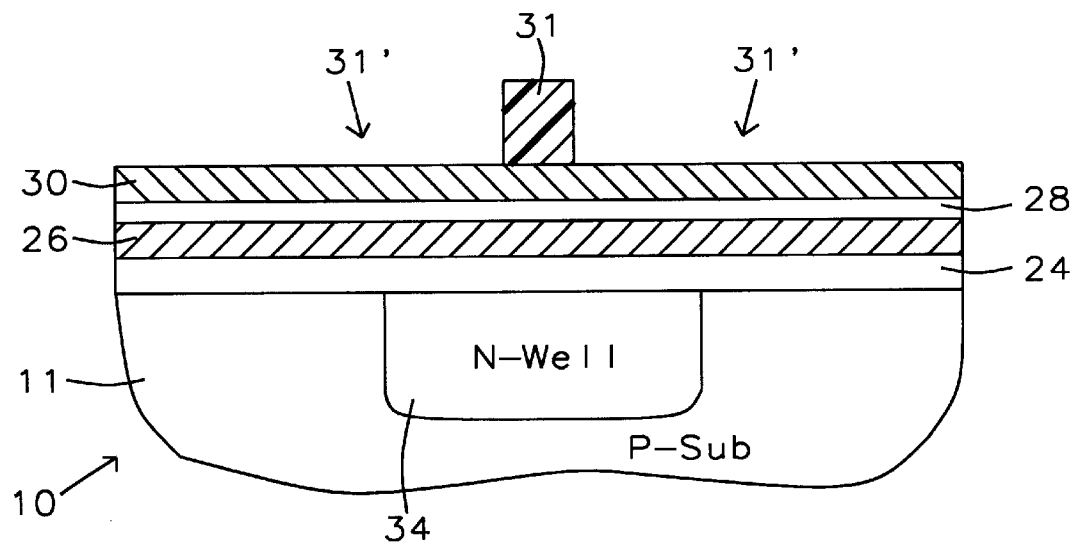
FIGS. 4D–4F are views of the device of FIG. 1A taken along line 4D–4D' in FIG. 1A illustrating the main aspects of the process of FIG. 3.
Figure 4E:
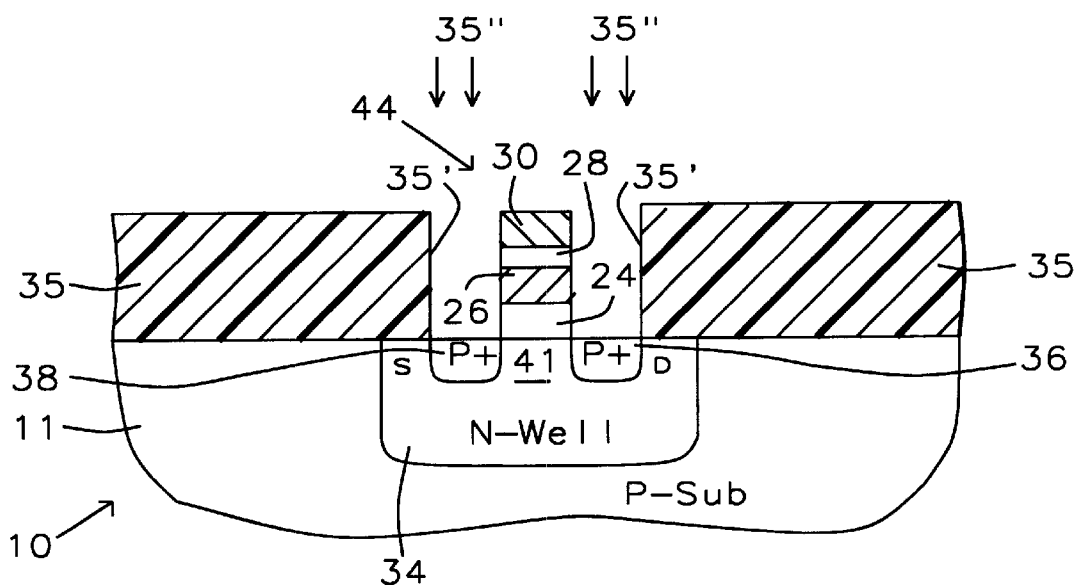
Figure 4F:
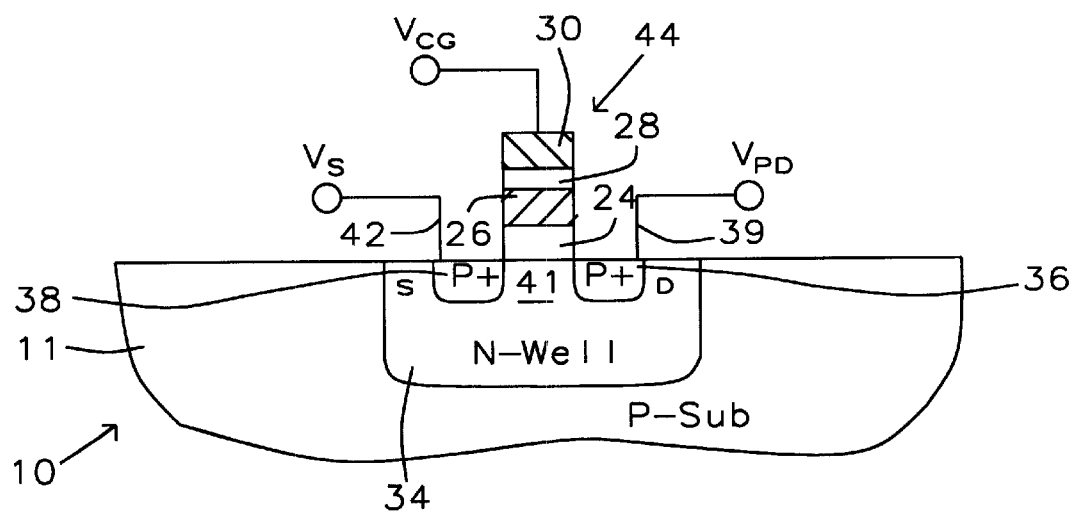

FIGS. 4A–4C are views of the device of FIG. 1A taken along line 4A–4A' illustrating the main aspects of the process of FIG. 3. from the point of view of the N-channel portion of the device. FIGS. 4D–4F are views of the device of FIG. 1A taken along line 4D–4D'. FIGS. 4A–4C and FIGS. 4D–4F show the same process steps in FIG. 3 from the point of view of the P-channel portion of the device.

Manufacture of the device 10 of FIG. 1A starts in step 100 in FIG. 3 with the silicon semiconductor P-doped substrate 11 using a conventional N-well mask (not shown) with an N-well opening formed therethrough down to the surface of the substrate 11. The N-doped well 34 (shown in FIG. 4D) is formed by doping with phosphorus N-type dopant yielding a concentration of N type dopant from about 1 E 15 atoms/cm$^3$ to about 1 E 17 atoms/cm$^3$ by doping at an energy from about 100 keV to about 150 keV with a dose of from about 1 E 12 ions/cm$^2$ to about 1 E 14 ions/cm$^2$. Then, the N-well mask is stripped away from the device 10.

In step 102, a conventional P-well mask (not shown) with a P-well opening is formed therethrough down to the surface of the substrate 11. The P-doped well 14 (shown in FIG. 4A) is formed by doping with boron (B) P type dopant yielding a concentration of P type dopant from about 1 E 15 atoms/cm$^3$ to about 1 E 17 atoms/cm$^3$ by doping at an energy from about 90 keV to about 150 keV with a dose of from about 1 E 12 ions/cm$^2$ to about 1 E 14 ions/cm$^2$. Then the P-well mask is stripped away from the device 10.

Then, as described below, a stack of layers used to form the gate electrode stack 44 is deposited upon device 10.

First, in step 104 a tunnel oxide layer 24 having a thickness from about 80 Å to about 100 Å is formed on the top surface of the device 10 by thermal oxidation.

Next, in step 106, a floating gate electrode layer 26, preferably comprising a polysilicon film from about 1,000 Å thick to about 1,200 Å thick, is formed on the top surface of the tunnel oxide layer 24. Then tunnel oxide layer 24 is doped with N+ type, phosphorus (P) dopant yielding a concentration of N+ dopant from about 1 E 18 atoms/cm$^3$ to about 1 E 20 atoms/cm$^3$.

It is also possible for the floating gate electrode layer 26 to be a laminated layer of undoped polysilicon/doped polysilicon/undoped polysilicon layers, as described below with reference to FIG. 5B.

Next, in step 108, an interelectrode dielectric layer 28 is formed over floating gate electrode 26. The interelectrode dielectric layer 28 has a thickness from about 150 Å thick to about 300 Å thick. Preferably, the interpolysilicon dielectric layer 28 is composed of ONO (silicon Oxide/silicon Nitride/ silicon Oxide).

Then, in step 110, a control gate electrode conductor layer 30 from about 1,500 Å thick to about 3,000 Å thick is formed on the overall surface of the interelectrode dielectric layer 28.

Assuming that control gate electrode conductor layer 30 comprises a second polysilicon layer, then polysilicon layer 30 is doped with boron fluoride ($BF_2$) P+ type dopant having a concentration of P+ dopant from about 1 E 18 atoms/cm$^3$ to about 1 E 20 atoms/cm$^3$.

A polycide/polysilicon control gate electrode can be employed in place of a polysilicon layer as described with reference to FIG. 5A below.

Then, referring to FIGS. 4A and 4D which show the device in the same stage of manufacture, at step 112, a mask 31 with gate electrode stack openings 31' therethrough is formed on the device 10. The gate electrode stack 44 is then patterned by etching through the openings 31' in mask 31 to etch away the unwanted portions of the control gate electrode layer 30, the interelectrode dielectric layer 28, the floating gate 26 and tunnel oxide layer 24 down to the surface of the device 10. Then the mask 31 is stripped away.

The gate electrode stack 44 of polysilicon film 30, dielectric layer 28, floating gate electrode 26 and tunnel oxide layer 24 serve as a self-aligned mask for the subsequent formation of source/drain regions in the device 10.

Next, in step 118 as shown in FIG. 4B, a new N+ source/drain mask 33 is formed with source/drain openings 33' therethrough above P-well 14. The openings 33' extend down to the surface of the substrate 11 above P-well 14. Then an N+ doped source region 18 and an N+ doped drain region 16 (self-aligned with the gate electrode stack 44) are formed, in P-well 14, by doping with arsenic (As) N-type dopant ions 33" yielding an N type dopant concentration of from about 1 E 18 atoms/cm$^3$ to about 1 E 20 atoms/cm$^3$ by doping at an energy from about 30 keV to about 30 keV with a dose of from about 1 E 14 ions/cm$^2$ to about 1 E 15 ions/cm$^2$.

Then strip away the N+ source/drain mask 33.

FIG. 4C shows the device of FIG. 4B after the mask 33 is stripped away leaving the device 10 with the source/drain regions 18/16 doped in the N-well 14.

Next, referring to FIG. 4E which shows the section of FIG. 4D after performing step 120 to form a new P+ source/drain mask 35 with source/drain openings 35' therethrough above N-well 34. The openings 35' extend down to the surface of the substrate 11 above N-well 34. The P+ doped source region 38 and drain region 36 are formed by doping with boron fluoride (BF$_2$) P type dopant ions 35" yielding a concentration of P type dopant from about 1 E 18 atoms/cm$^3$ to about 1 E 20 atoms/cm$^3$ by doping at an energy from about 30 keV to about 30 keV with a dose of from about 1 E 14 ions/cm$^2$ to about 1 E 15 ions/cm$^2$.

Then strip away the N+ source/drain mask 35.

Again, in step 120, the gate electrode stack 44 of polysilicon film 30, dielectric layer 28, floating gate electrode 26 and tunnel oxide layer 24 serve as a self-aligned mask for the source/drain regions 38/36.

FIG. 4F shows the device of FIG. 4E after the mask 35 is stripped away leaving the device 10 with the source/drain P+ doped regions 38/36 formed in the N-well 34.

Next in step 122, the device is annealed in a conventional manner to drive in the dopant.

After annealing, the N+ source/drain regions 18/16 have a concentration of arsenic (As) N+ dopant from about 1 E 18 atoms/cm$^3$ to about 1 E 20 atoms/cm$^3$; and the source/drain regions 38/36 have a concentration of (BF$_2$) P+ dopant from about 1 E 18 atoms /cm$^3$ to about 1 E 20 atoms/cm$^3$.

Contacts, wiring lines and terminals connected to the device in accordance with procedures well known to those skilled in the art are shown in FIGS. 4C and 4E. In particular, control gate electrode 30 is connected to the voltage source $V_{CG}$. The P+ doped source regions 18 and 38 are connected via lines 42 to the voltage source $V_S$. The N+ doped drain region 16 in FIG. 4C is connected via line 19 to the voltage source $V_{ND}$. The P+ doped drain region 36 in FIG. 4E is connected via line 39 to the voltage source $V_{PD}$.

Then the back end of the line steps follow to complete the manufacture of the device as will be well understood by those skilled in the art.

FIG. 5A shows an N-channel EPROM 10 in accordance with this invention formed in P-doped silicon region 14 in which source/drain regions 18/16 are formed. Located on the surface of the P-substrate 14 is the gate electrode stack 44 comprising the tunnel oxide layer 24, the floating gate electrode 26, the interelectrode dielectric layer 28 and the control gate electrode 30 which is connected to the voltage $V_{CG}$. The N+ source region 18 is connected to voltage $V_S$. The N+ drain region 16 is connected to the voltage $V_D$. This device is adapted to use for hot electron injection into the floating gate electrode 26. However, the device 10 is prone to being depleted after CHE (Channel Hot Electron) programming. Depleted devices of the kind shown in FIG. 5A are difficult to design in many applications. Referring to Table II below, in the write phase, the control gate 30 is operated at 12.5V, with the source region 18 at ground, the drain region 16 at 6V with electrons e– e– in the channel between the source region 18 and drain region 16 in the P-sub 14.

FIG. 5B shows an energy band diagram for the device 10 of FIG. 5A. To the left is the floating gate 26. In the center is the tunnel oxide (T.O.) region 24 with the N+ drain region 16 to the right. It can be seen that the gap from region 24 to region 16 is relatively low compared to FIG. 5D.

The programming voltages for the device of FIG. 5A are shown in Table III below.

TABLE III

|  | $V_{CQ}$ | $V_{ND}$ | $V_S$ | $V_{B1}$ |
|---|---|---|---|---|
| WRITE | 12.5 V | 6 V | 0 V | 0 V |
| ERASE | –12 V | X | 4.3 V | 0 V |

FIG. 5C shows a P-channel stacked-gate electrode Flash EPROM 30, which is intended to have higher channel hot-electron injection rate of the kind seen in FIG. 5A. However, the device of FIG. 5A is prone to being depleted after CHE (Channel Hot Electron) programming. Depleted devices are difficult to design in many applications.

The flash EEPROM 30 of FIG. 5C formed in N-Well 34 with source/drain regions 38/36 are formed includes the gate electrode stack 44 of tunnel oxide layer 24, floating gate electrode 26, interelectrode dielectric layer 28 and control gate electrode 30 which is connected to the voltage source $V_{CG}$. The P+ source region 36 is connected to voltage $V_S$ as indicated in TABLE IV below. The P+ drain region 38 is connected to the voltage source $V_{PD}$.

When writing, the control gate 30 is operated at –5V, with the source region 36 at ground (0V), the drain region 38 at –8V with electron holes h+ h+ in the channel between the source region 36 and drain region 38 in the N-well 34.

FIG. 5D shows an energy band diagram for the device of FIG. 5C. To the left is the floating gate 26. In the center is the tunnel oxide (T.O.) region 24 with the P+ drain region 36 to the right. It can be seen that the gap from region 16 to region 36 is higher.

The programming voltages for the device of FIG. 5C are shown in TABLE IV below.

TABLE IV

|  | $V_{CG}$ | $V_{PD}$ | $V_S$ | $V_B$ |
|---|---|---|---|---|
| WRITE | –5 V | –8 V | 0 V | 0 V |
| ERASE | –12 V | 4.3 V | X | 0 V |

Preferably floating gate electrode 26 is a laminated structure in which the lower layer is an undoped polysilicon layer, the intermediate layer is a doped polysilicon layer, and the upper layer is an undoped polysilicon layer.

The control gate electrode 30 can be a conventional metal silicide type electrode of the kind employed in FET devices. Such polycides are a combination of polysilicon and silicides. A typical polycide has a lower level of polysilicon with an upper level of silicide. They have the positive features of both layers with good stability, adherence, and coverage (from the polysilicon) and a high conductivity path from the silicide. The first layer comprises a material selected from polysilicon and a polycide selected from the group consisting of $WSi_2$, $TiSi_2$, $CoSi_2$, and $MoSi_2$; the second layer comprises a material selected from polysilicon and a polycide selected from the group consisting of $WSi_2$, $TiSi_2$, $CoSi_2$, $MoSi_2$, and $TaSi_2$.

The control gate electrode 30 is connected to the voltage source $V_{CG}$, The P+ source region 38 is connected to voltage $V_S$ ground. The P+ drain region 36 is connected to the voltage source $V_{PD}$.

Figure 6:
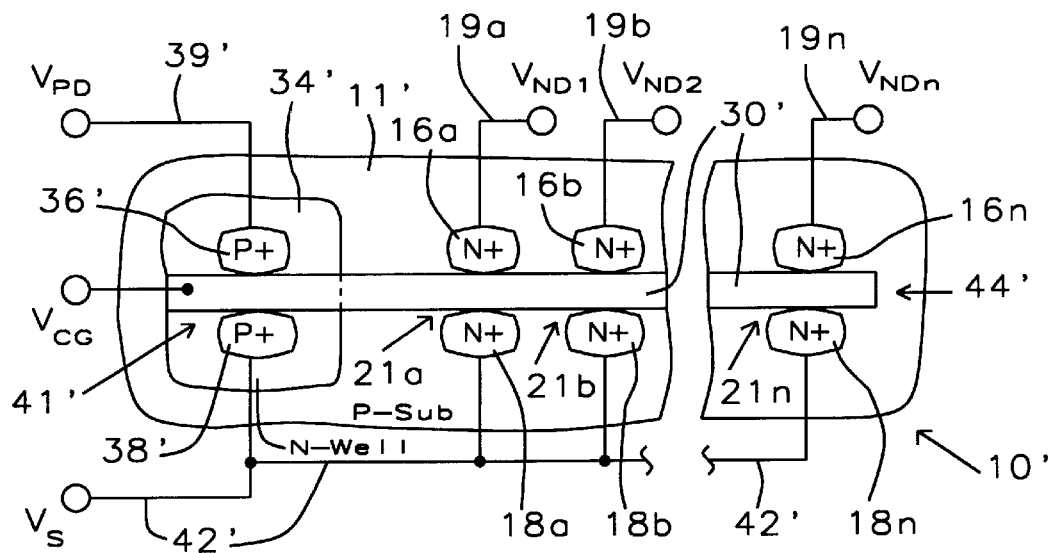
FIGS. 6 and 7 show how one P-channel portion in N-well of an omnibus EEPROM can make contact to 1, 2, 3 or more N-channel portions of a multiple portion EEPROM.
Figure 7:
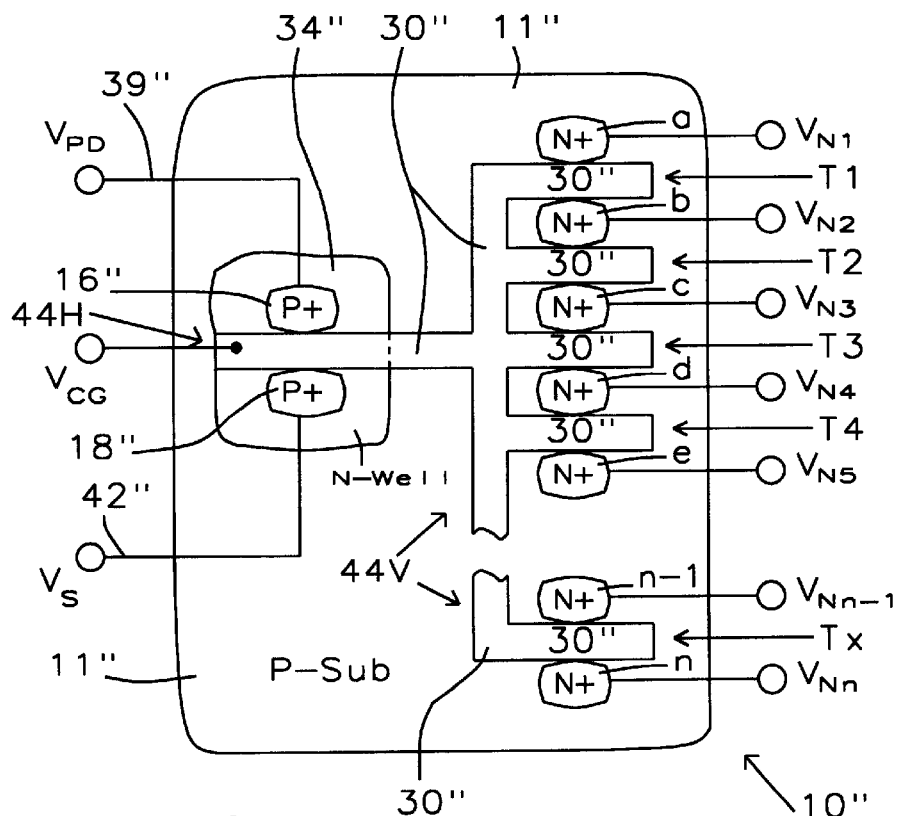

FIGS. 6 and 7 show how one P-channel portion in N-well of an omnibus EEPROM can make contact to 1, 2, 3 or more N-channel portions of a multiple portion EEPROM.

As will be well understood by those skilled in the art, like numbers in the drawings correspond to like numbers in previous drawings with modifications being indicated by apostrophes and quotation marks.

In FIG. 6, a series arrangement of the N-channel portions of an EPROM is shown. There is an N-doped N-Well 34' in which P+ doped source/drain regions 38'/36' are formed with a P-channel 41' therebetween. There is a gate electrode stack 44' above the P-channel 41', between the source/drain regions 38'/36'. Stack 44' (which is topped by control gate 30') extends to the right serving as the gate electrode stack for a series of N-channel devices which include a series of N+ doped source/drain pairs 16a/18a, 16b/18b, ... 16n/18n which are formed in P-substrate 11'. The source/drain pairs are located on either side of a series of N-channel regions 21a, 21b, 21b, ... 21n beneath the gate electrode stack 44. The source regions 18a, 18b ... 18n are connected to voltage source $V_S$ by lines 42'. The drain regions 16a, 16b, ... 16n are connected, respectively to voltage sources $V_{ND1}$, $V_{ND2}$, ... $V_{NDn}$ by lines 19a, 19b, ... 19n, respectively.

Alternatively, as will be well understood by those skilled in the art, the substrate 11 can be an N-substrate.

In FIG. 7, a parallel arrangement of the N-channel portions of an EEPROM is shown.

There is an N-doped N-Well 34" in which a pair of P-channel P+ doped source/drain regions 18"/16" are formed. A "rake"-shaped gate electrode stack 44H, 44V is formed above the N-well 34" (extending between the source/drain regions 18"/16"). The gate electrode stack (which is topped by control gate electrode 30") has a horizontally extending leg 44H which reaches across the P-substrate 11" to join a vertically extending control gate electrode leg 44V of the gate electrode stack 44H/44V in the N-channel region of the device 11".

From the vertically extending leg 44V extend a set of teeth-like, horizontally extending gate electrode stack segments T1, T2, T3, T4, ... Tx which extend in parallel to the right of the vertically extending leg 44V.

A set of N-channel regions beneath the stack segments T1, T2, T3, T4, ... Tx are formed in P-substrate 11", in parallel, with a plurality of N+ doped regions a, b, c, d, e ... n-1, n located on either side of gate electrode stack segments T1, T2, T3, T4, ... Tx and N-channel regions.

The N+ doped regions a, b, c, d, e ... n-1, n are connected to voltage source $V_{ND1}$, $V_{N1}$, $V_{N2}$, ... $V_{NN}$ by lines 19a, 19b, ... 19n, respectively.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

What is claimed is:

1. An FET semiconductor device formed on a doped silicon semiconductor substrate having a surface, comprising:

the substrate being lightly doped with a P-type of dopant with an N-well and a P-region formed in the substrate with the N-well in side-by-side relationship with the P-region with an interface between the N-well and the P-region and with a pair of P+ doped source/drain regions formed in the N-well and a plurality of N+ doped regions formed in the P-region, a unitary gate electrode stack spanning across the N-well and the P-region over the surface of the substrate with the gate electrode stack bridging between the P+ doped source/drain regions in the N-well and the plurality of N+ doped regions in the P-region, comprising as follows:

a) a tunnel oxide layer over the surface of the substrate,
b) a floating gate electrode layer over the tunnel oxide layer,
c) an interelectrode dielectric layer over the floating gate electrode,
d) a control gate electrode over the interelectrode dielectric layer, and
e) the gate electrode stack bridging between the P+ doped source/drain regions in the N-well and between the plurality of N+ doped regions in the P-region, the unitary gate electrode stack extending across the N-well between the P+ doped source/drain regions and across the N-well and the P-region between the N+ doped regions in the substrate outside of the N-well, providing a single gate electrode stack spanning across the N-well and the P-region, the plurality of N+ doped regions being formed on opposite sides of the gate electrode stack in the P-region self-aligned with the unitary gate electrode stack, a Channel Hot Electron (CHE) injector is formed including the P+ doped source/drain regions formed in the N-well self-aligned with the unitary gate electrode stack, and the unitary gate electrode stack arranged in a pattern comprising the unitary gate electrode stack being formed into a rake-shaped pattern extending between the set of P+ doped source/drain regions in the N-well and across the substrate and between the parallel array of the plurality of N+ doped regions.

2. A device in accordance with claim 1 wherein the P+ doped source/drain regions comprise P type dopant atoms of boron fluoride with a concentration from about 1 E 18 atoms/cm$^3$ to about 1 E 20 atoms/cm$^3$.

3. A device in accordance with claim 1 wherein the N+ doped regions comprise N type dopant atoms of arsenic with a concentration from 6 about 1 E 18 atoms/cm$^3$ to about 1 E 20 atoms/cm$^3$.

4. A device in accordance with claim 1 wherein the tunnel oxide layer is from about 80 Å to about 100 Å thick.

5. A device in accordance with claim 1 wherein the floating gate electrode comprises a layer from about 1,000 Å to about 1,200 Å thick.

6. A device in accordance with claim 1 wherein the interelectrode dielectric layer is from about 150 Å to about 300 Å thick.

7. A device in accordance with claim 1 wherein the control gate electrode has a thickness from about 1,500 Å to about 3,000 Å.

8. A device in accordance with claim 1 wherein:
the tunnel oxide layer is from about 80 Å to about 100 Å thick, the P+ doped source/drain regions comprise P type dopant atoms with a concentration from about 1 E 18 atoms/cm$^3$ to about 1 E 20 atoms/cm$^3$, and the N+ doped regions comprise N type dopant atoms with a concentration from about 1 E 18 atoms/cm$^3$ to about 1 E 20 atoms/cm$^3$.

9. A device in accordance with claim 1 wherein the P-substrate is doped by P type dopant boron atoms with a concentration from about 1 E 13 atoms/cm$^3$ to about 1 E 15 atoms/cm$^3$.

10. A device in accordance with claim 1 wherein the P-substrate is doped by P type dopant boron atoms with a concentration from about 1 E 13 atoms/cm$^3$ to about 1 E 15 atoms/cm$^3$ the tunnel oxide layer is from about 80 Å to about 100 Å thick, the floating gate electrode comprises a layer from about 1,000 Å to about 1,200 Å thick, the interelectrode dielectric layer is from about 150 Å to about 300 Å thick, the control gate electrode comprises a layer from about 1,500 Å to about 3,000 Å thick, the P+ doped source/drain regions comprise P type dopant atoms of boron fluoride with a concentration from about 1 E 18 atoms /cm$^3$ to about 1 E 20 atoms/cm$^3$, and the N+ doped regions comprise N type dopant atoms of arsenic with a concentration from about 1 E 18 atoms/cm$^3$ to about 1 E 20 atoms/cm$^3$.

11. An omnibus EEPROM FET semiconductor device comprising:

a doped silicon semiconductor substrate having a surface, with an N-well and a P-region formed in the substrate with the N-well being located in side-by-side relationship with the P-region with an interface between the N-well and the P-region, a doped silicon semiconductor substrate having a surface, the substrate being lightly doped with a P type of dopant, a P-channel Channel Hot Electron (CHE) injector including a pair of P+ doped source/drain regions formed in the N-well formed in the substrate, a plurality of pairs of N+ doped source/drain regions formed in the P-region, a unitary gate electrode stack including a tunnel oxide layer over the surface of the substrate, a floating gate electrode layer over the tunnel oxide layer, an interelectrode dielectric layer over the floating gate electrode, and a control gate electrode layer over the interelectrode dielectric layer, spanning across the N-well and the P-region over the surface of the substrate with the gate electrode stack bridging the N-well and the P-region, the unitary gate electrode stack extending across the N-well between the the pair of P+ doped source/drain regions and across the N-well and the P-region between the N+ doped source/drain regions in the substrate outside of the N-well, providing a single gate electrode stack spanning across the N-well and the P-region, the N+ doped source/drain regions for N-channel devices being formed on opposite sides of the unitary gate electrode stack in the P-region self-aligned therewith, and the P+ doped source/drain regions for P-channel devices being formed on opposite sides of the unitary gate electrode stack in the N-well self-aligned therewith, and the unitary gate electrode stack has a rake-shaped pattern extending between the pairs of P+ doped source/drain regions in the N-well and across the substrate and between a parallel array of the pairs of N+ doped source/drain regions in the substrate outside of the N-well.

12. A device in accordance with claim 11 wherein the P-substrate is doped by P type dopant boron atoms with a concentration from about 1 E 13 atoms/cm$^3$ to about 1 E 15 atoms/cm$^3$ the tunnel oxide layer is from about 80 Å to about 100 Å thick, the floating gate electrode comprises a layer from about 1,000 Å to about 1,200 Å thick, the interelectrode dielectric layer is from about 150 Å to about 300 Å thick, the control gate electrode comprises a layer from about 1,500 Å to about 3,000 Å thick, the P+ doped source/drain regions comprises P type dopant atoms of boron fluoride with a concentration from about 1 E 18 atoms/cm$^3$ to about 1 E 20 atoms/cm$^3$, and the N+ doped source/drain regions comprise N type dopant atoms of arsenic with a concentration from about 1 E 18 atoms/cm$^3$ to about 1 E 20 atoms /cm$^3$.

* * * * *

UNITED STATES PATENT AND TRADEMARK OFFICE
CERTIFICATE OF CORRECTION

PATENT NO.    : 6,455,887 B1                                        Page 1 of 1
DATED         : September 24, 2002
INVENTOR(S)   : Yai-Fen Lin et al.

It is certified that error appears in the above-identified patent and that said Letters Patent is hereby corrected as shown below:

<u>Title page,</u>
Item [75], delete "Shiou-Hann Liaw, Hsiu-Chu", and replace with
-- Shiou-Hann Liaw, Hsin-Chu --.

Signed and Sealed this

Eighth Day of April, 2003

JAMES E. ROGAN
*Director of the United States Patent and Trademark Office*